US007877720B2

(12) United States Patent
Staiger et al.

(10) Patent No.: US 7,877,720 B2
(45) Date of Patent: Jan. 25, 2011

(54) METHOD AND TOOL FOR DESIGNING ELECTRONIC CIRCUITS ON A PRINTED CIRCUIT BOARD

(75) Inventors: Dieter Staiger, Weil im Schoenbuch (DE); Harald Huels, Horb a.N. (DE)

(73) Assignee: International Business Machines Corporation, Armonk, NY (US)

( * ) Notice: Subject to any disclaimer, the term of this patent is extended or adjusted under 35 U.S.C. 154(b) by 457 days.

(21) Appl. No.: 11/850,779

(22) Filed: Sep. 6, 2007

(65) Prior Publication Data

US 2008/0168415 A1 Jul. 10, 2008

(30) Foreign Application Priority Data

Jan. 8, 2007 (EP) .................................. 07100194

(51) Int. Cl.
*G06F 17/50* (2006.01)
(52) U.S. Cl. ........................................................ 716/15
(58) Field of Classification Search .................... 716/15
See application file for complete search history.

(56) References Cited

U.S. PATENT DOCUMENTS

| 4,744,084 | A | | 5/1988 | Beck et al. | |
|---|---|---|---|---|---|
| 5,745,371 | A | * | 4/1998 | Shouen ......................... | 716/15 |
| 6,377,912 | B1 | * | 4/2002 | Sample et al. ................. | 703/28 |
| 6,467,074 | B1 | * | 10/2002 | Katsioulas et al. ............ | 716/17 |
| 6,546,528 | B1 | * | 4/2003 | Sasaki et al. .................... | 716/5 |
| 6,581,191 | B1 | * | 6/2003 | Schubert et al. ................ | 716/4 |

* cited by examiner

*Primary Examiner*—Vuthe Siek
*Assistant Examiner*—Brandon W Bowers
(74) *Attorney, Agent, or Firm*—Richard Kotulak; Roberts Mlotkowski Safran & Cole, P.C.

(57) ABSTRACT

The invention relates to a design method and tool for designing electronic circuits on a printed circuit board (10), wherein at least one self-contained, pre-composed domain is used, wherein the domain (110, 120, 130, 140, 150, 150, 160) is a module chosen from a pre-composed architecture library, comprising self-contained pre-designed electronic modules represented by logical architecture and corresponding physical architecture.

4 Claims, 8 Drawing Sheets

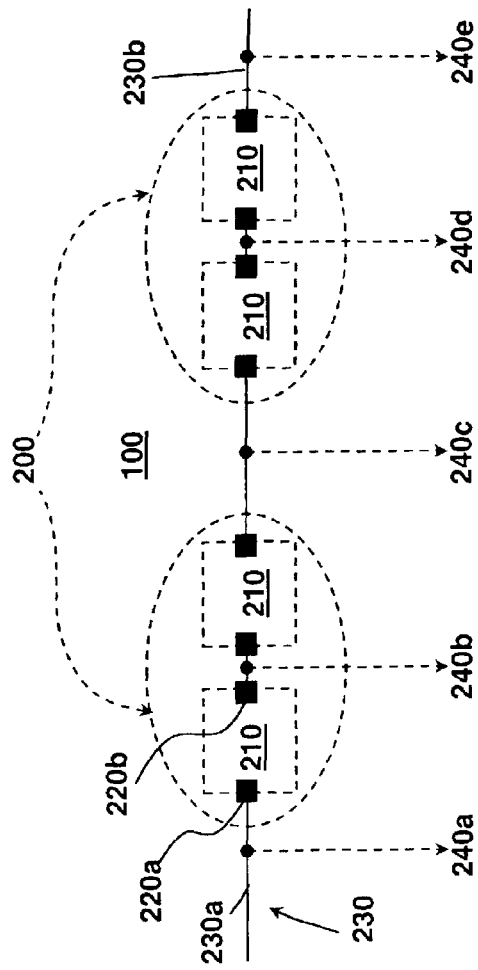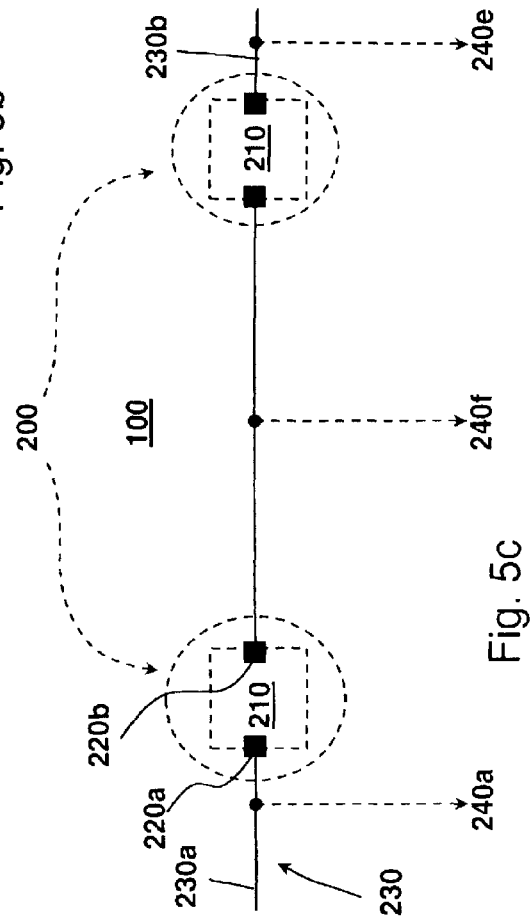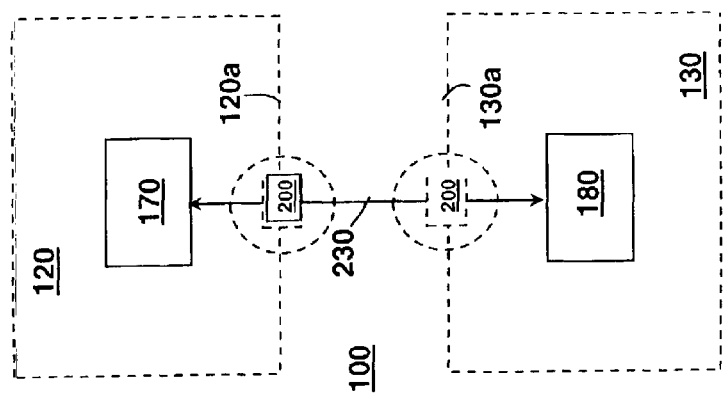

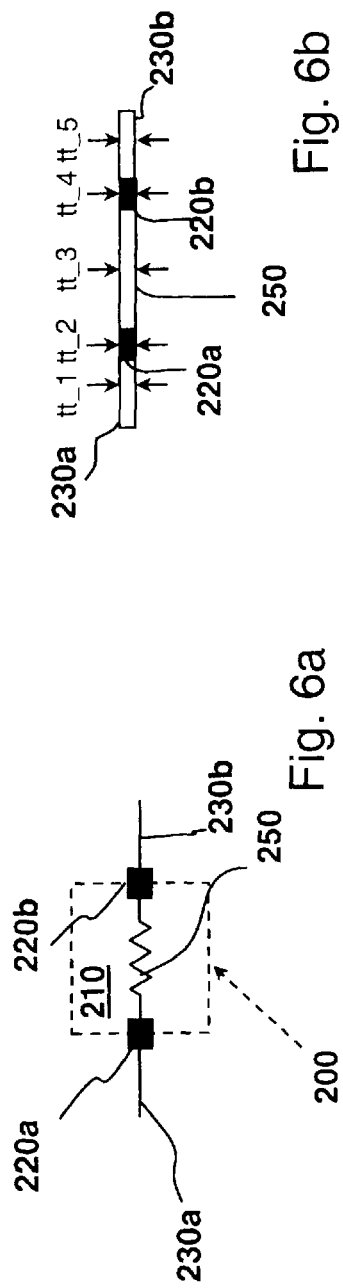
Fig. 6a
Fig. 6b
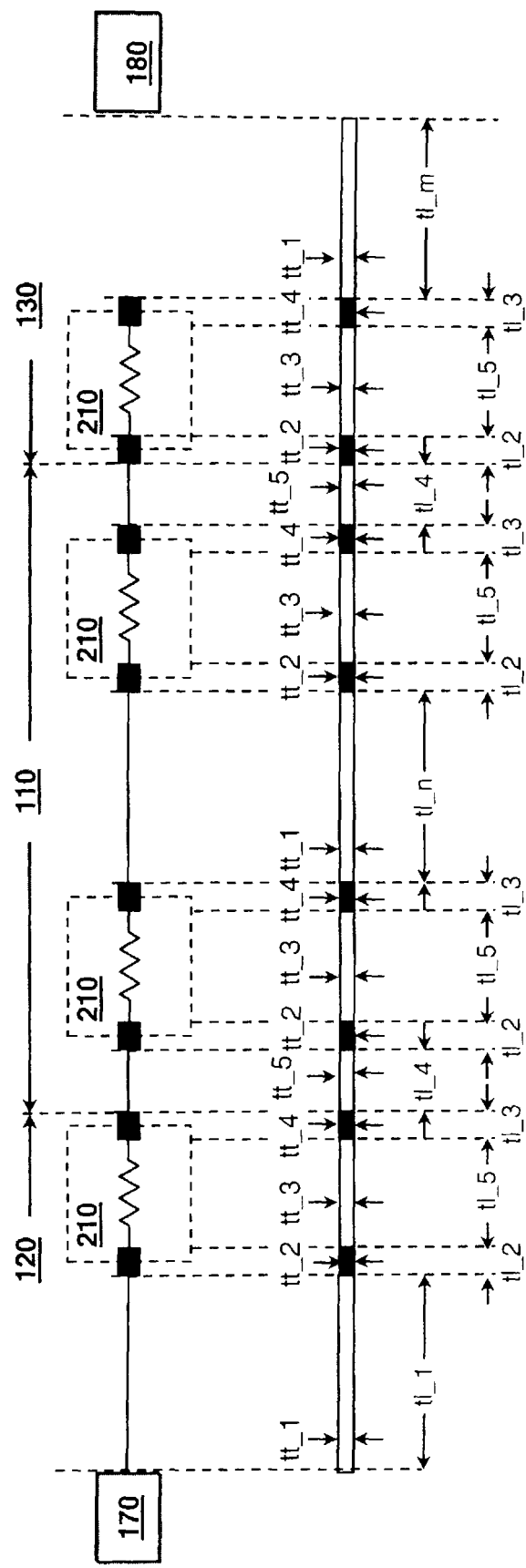
Fig. 6c

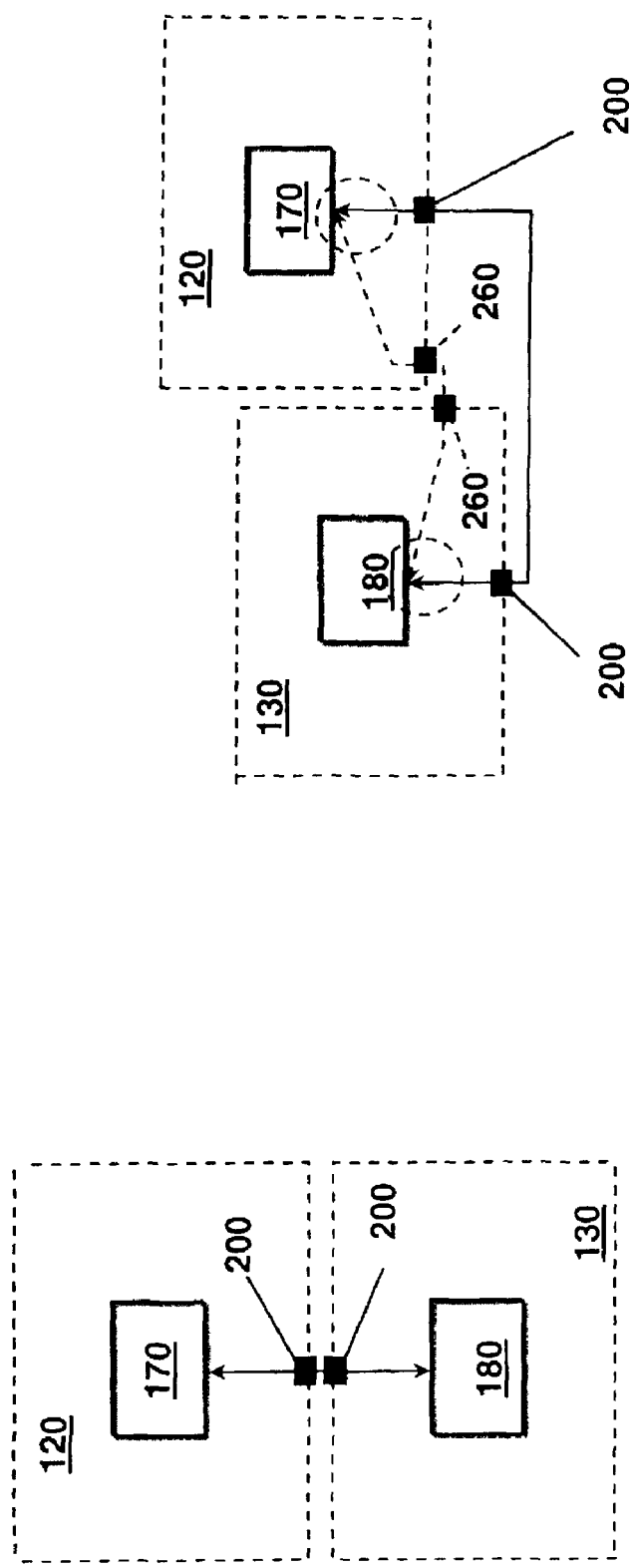

METHOD AND TOOL FOR DESIGNING ELECTRONIC CIRCUITS ON A PRINTED CIRCUIT BOARD

CROSS REFERENCE TO RELATED APPLICATION

This application claims priority under 35 U.S.C. 119 to European Patent Office (EPO) Application Number. EP07100194, filed Jan. 8, 2007.

FIELD OF THE INVENTION

The invention relates to a design method and tool for designing electronic circuits on a printed circuit board.

BACKGROUND OF THE INVENTION

Today's advanced modular design techniques use hierarchical designs subdividing system functions into functional modules. Modern electronic design tools are supporting hierarchical designs allowing designers to productively work applying top-down design methodologies as an effective precondition leading to modular system portioning.

System design applying the advanced methods typically consists of multiple top-level modules which are tied together in the top-level design finally representing the comprehensive system electronics. Each of the top-level modules may subsequently consist of one or more sub-level design entities, thus consequently following up a modular system approach. The electronic modules and sub modules developed applying this method are representing so called "functional modules", by means of each module or sub-module is a logical implementation of a part/sub-part of the overall system electronics. These advanced design methods provide modularization on the level of logical architecture of an electronic circuit.

One big advantage of these design methods is the reusability of the functional modules on new system designs. These modules, however, are covering the logical system partitioning only and are not covering the physical design leading to the real hardware. The logical modules known in the art usually are tied together finally representing a so called flat physical design model, thus giving up or loosing the modularity.

For complex electronic board designs, i.e. a personal computer or a workstation, the physical design is representing the most time consuming and critical design effort of an overall system design effort. Within this design phase, all components will be placed to their physical board location with respect to timing and signal integrity concerns, board layer assignment and wire-ability and not at least power integrity requirements.

Critical electronic areas such as the processing subsystem, the memory subsystem, the high speed IO-electronics (IO=input/output) can pose problems even for minor design changes. Even when reusing key functional modules, new system designs or logically simple design changes in critical electronic areas or the power subsystem require to re-exercise the entire board physical design including time expensive signal integrity and power integrity simulations and respective redesigns. For these reasons migrating to the next level of processor variant, adding new features, upgrading performance as "very typical incremental" new designs even within a system family still require expensive development budget and development time-frame. Additionally, a certain quantum of new-design risk cannot be neglected. Besides the high cost and long development time for new system generations and the limited reusability of designs and components of predecessor systems, comprehensive development teams are required for each new design. Experienced and highly skilled specialists are needed for each sub-electronics area such as power design, digital design, analog design, IO-design, clock tree, timing etc.

SUMMARY OF THE INVENTION

It is an object of the invention to provide a fast and cost efficient design method and tool for designing electronic circuits on a printed circuit board on the logical as well as on the physical level which are improved over the prior art.

The object is achieved by the features of the independent claims. The other claims and the description disclose advantageous embodiments of the invention.

The invention can favorably cover the entire design and development process for electronic systems, especially complex electronic circuits. Preferred main areas are electronic circuitry development as well as board design—especially physical design such as component placement, board wiring-, firmware development, simulation—such as functional, system timing, signal integrity, power integrity, EMC (electromagnetic compatibility)-, as well as initial system bring-up and functional verification. Other than today's design proceedings, where printed circuit boards are designed manually causing problems to place all necessary components on the board due to the high degree of integration and limited available space, the invention allows for automating a part of the design work by using reusable pre-composed modules. An exchange of components of different manufacturers of standardized system platforms or of a product family (for example with equal chip sets, similar design elements) is facilitated.

The pre-composed architecture library describes a method for developing complex electronic boards in a comprehensive modular approach. The architecture library can favorably provide a sub-component library allowing developing new systems in lower design effort, reduced development time and reduced risk typically going along with new system designs.

The invention makes use of advanced design methods utilizing functional modules. In context with the invention this module level is referred to as logical architecture.

The design method for designing an electronic circuit according to the invention uses at least one self-contained pre-designed domain which is reusable in related electronic products and which is represented by logical as well as physical architecture. The design method is preferably applied in design of a printed circuit board.

Preferably, the at least one pre-designed domain is a module chosen from a pre-composed architecture library, the architecture library comprising self-contained pre-designed electronic modules.

The architecture library can provide self-contained functional domains represented by logical architecture and corresponding physical architecture, virtual connectors representing at least one interconnect component positioned at a physical borderline of a domain outline, a connector domain as an outer outline functioning as a container providing reserved real-estate areas allowing to embedding the functional domains. Most preferably, the domains used for a concrete printed circuit board exhibit the same number of wiring layers and are composed of the same material, and equal interfaces, for example busses, are specified between the domains via the virtual connectors.

According to the preferred method, the logical components and sub-designs of the targeted products are organized with respect to commonality. These components and sub-designs comprise for example one or more processors, one or more memories, IO-components/systems, power, clocking (for example generation, distribution), human interface etc.

The domains are defined with respect to wide usability of targeted products and correlate logical architecture and physical architecture. A domain should best be understood as a functional entity consisting of logical architecture and correlating physical architecture. Logical architecture and physical architecture are primary architectures of the method. The method can span to simulation architecture, firmware, testing as secondary architecture. For example, a support domain is defined by identifying system support functions and miscellaneous circuitry and extracting these from a flat main system to a specific support domain. Separate processor related electronics can be extracted from IO-subsystems in a processing domain and the remaining IO-circuitry can be extracted to an IO-domain.

Building up such an architecture library, especially with interrelated electronic products ("product family") in focus, enables to design and build new systems in short time frame. New systems can be designed by "assembling" verified self-contained pre-designed architecture library modules (domains). Development costs savings can be gained by reusing and eventually adjust or tune verified pre-designed architecture library modules. By assembling those existing verified pre-designed modules development times for new products are shortened resulting in a reduced time to market for new products. Utilizing mature pre-designed architecture library modules can significantly reduce the design risk on design-critical subsystems.

After defining the domains and the specific domain topology, including the domain sub-structures, focusing on a "family" of related products, inputs and/or outputs to each domain are defined, preferably with exact interface definition on a logical view and a physical view. Defining on a simulation view, firmware view and test view is also possible if required.

Thus, the at least one pre-designed domain comprises a functional subsystem of the electronic circuit.

In another step, a connector domain is defined. The connector domain is a design bed accommodating the functional domains, providing the electrical wiring board space to interconnect the various functional domains. Linked designs of internal main system domains typically hold system connectors, board connectors, subsystems (i.e. optional feature card connectors), physical line drivers and transceivers. The at least one pre-designed domain can provide specific common interfaces enabling to interconnect at least two pre-designed domains. Preferably, the connector domain provides product specific physical shapes with reserved outline areas. The shapes are reusable, allowing functional domains in product specific orientation and/or arrangement.

According to a preferred design rule product family domains are specified to apply identical board cross sections. Typically, the cross section comprises a multitude of layers on a board.

According to a preferred embodiment, interconnection of the domains is provided by virtual connectors, wherein each connector includes constraints to establish electrical connection according to overall system design specification. The virtual connectors provide interconnection of top-level domains passing the connector domain. As a matter of course, direct linking of domains not crossing the connector domain can be supported by the virtual connectors as well.

Preferably, each virtual connector comprises at least one connector component. The connector component preferably considers electrical and physical constraints the wire and/or the electrical load has to meet, for example from the position of the virtual connector component to the next connector component. Such constraints reasonably comprise spacing and physical rules (such as trace length, minimum/maximum width, via definitions etc.), electrical parameters (such as impedance, cross-talk, maximum vias, etc.), propagation delay and/or related propagation delay (such as length matching, Timing etc.) and design rule check (DRC) definitions.

Favorably, the design constraints of the functional domains are assigned to each respective virtual connector of the respective functional domain. Preferably both connector components of one virtual connector are subject to the same design constraints.

The connector components are positioned at the domain borderline(s). In a first embodiment, a pair of connector components is required to interconnect two domains. In another simplified embodiment, when the connector domain is a unique design, the virtual connectors of the transmitting domain and the receiving domain can directly connect.

As a key attribute, the virtual connector has no electrical function and does to no extend influence the signal integrity. It is neutral to and thus does not influence the electrical attributes of the entire connection reaching from the transmitting components, passing one or more virtual connectors to connecting to the receiving component. The virtual connectors are electronically neutral to electronic circuit behavior of the domains connected by the virtual connectors. The virtual connector component can be positioned in any layer of the respective outline cross section, wherein it acts as a domain IO-point (IO=input/output point). Any other domain is to be attached by connecting to the respective virtual connectors.

The virtual connector can be represented by a connector component physically consisting of wire trace segments. The connector component can be represented as a first connector tab connected to a connector input trace and a second connector tab connected to a connector output trace, wherein a resistor trace is arranged between the tabs for connecting the pads.

Preferably, the tabs and the traces are represented by minimum length trace stubs. Also preferably, trace widths of the tabs and the traces are identical. Also preferably, the resistor trace can be represented by a zero-Ohm resistor with a specific foot print.

It is possible to provide at least two virtual connectors on a borderline of a functional domain, thus providing redundant virtual connectors to allow for selectively choosing a specific virtual connector. This provides increased design freedom for example between different boards of a product family incorporating preferred functional domains and virtual connectors.

The logical architecture and corresponding physical architecture of the domains can be complemented with secondary corresponding architecture, resulting in a powerful and comprehensive concept design.

A domain assembly can be used to build-up new target systems with different boards. By assembling the system(s) specific applying the functional domains embedded into the connector domain, interconnected by connecting to the virtual connectors.

BRIEF DESCRIPTION OF THE DRAWINGS

The present invention together with the above-mentioned and other objects and advantages may best be understood from the following detailed description of the embodiments, but not restricted to the embodiments, wherein is shown schematically:

FIG. 5a,b,c a representation of virtual connectors interconnecting an IO-domain to a processing domain passing a connector domain (FIG. 5a), the virtual connectors represented by connector components (FIG. 5b) and an example of direct linking of without passing a connector domain (FIG. 5c);

FIG. 6a,b,c an implementation of virtual connectors and a connector component (FIG. 6a) and its representation by pads and traces (FIG. 6b), and a connection through virtual connectors from a CPU/Northbridge to a IO-hub (FIG. 6c);

FIG. 8a,b,c virtual connectors between a processing domain and a IO-domain (FIG. 8a), positioning of redundant virtual connectors (FIG. 8b) and an implementation of redundant virtual connectors (FIG. 8c).

In the drawings, similar elements are referred to with same reference numerals.

DETAILED DESCRIPTION

The pre-composed/pre-designed architecture library describes a method for developing complex electronic boards in a comprehensive modular approach. The pre-composed architecture library enables to design and build new systems in a short time frame.

Initially, the target system/product family specifics have to be considered such as system form factors (i.e. for a tower, a desktop, a blade etc.), functional requirements (performance, IO, features, etc.), environmental requirements (thermal, acoustic, etc.). The system form factors are driven by target system specifications such as using open standard boards or blade/ATCA-blade (rack mounted system boards), small form factor systems or embedded systems or a 1 unit/2 unit rack server or such.

In a first step, pre-composed architecture library domains are defined with corresponding logical and physical system partitioning. In a second step, the specific system domain topology is defined, including domain sub-structures, focusing on a family of related products. According to the invention, the logical system partitioning and the physical partitioning correspond to each other.

Examples of product families are

Power processor based systems, such as desktop personal computers, rack servers, Blade servers etc, systems based on processors of different manufacturers (like AMD, Intel etc.), such as desktop personal computers, rack servers, Blade servers etc, embedded POWER platform based systems (POWER is a trademark of IBM), such as automotive Head-Units, portable navigation systems etc.

Figure 1:
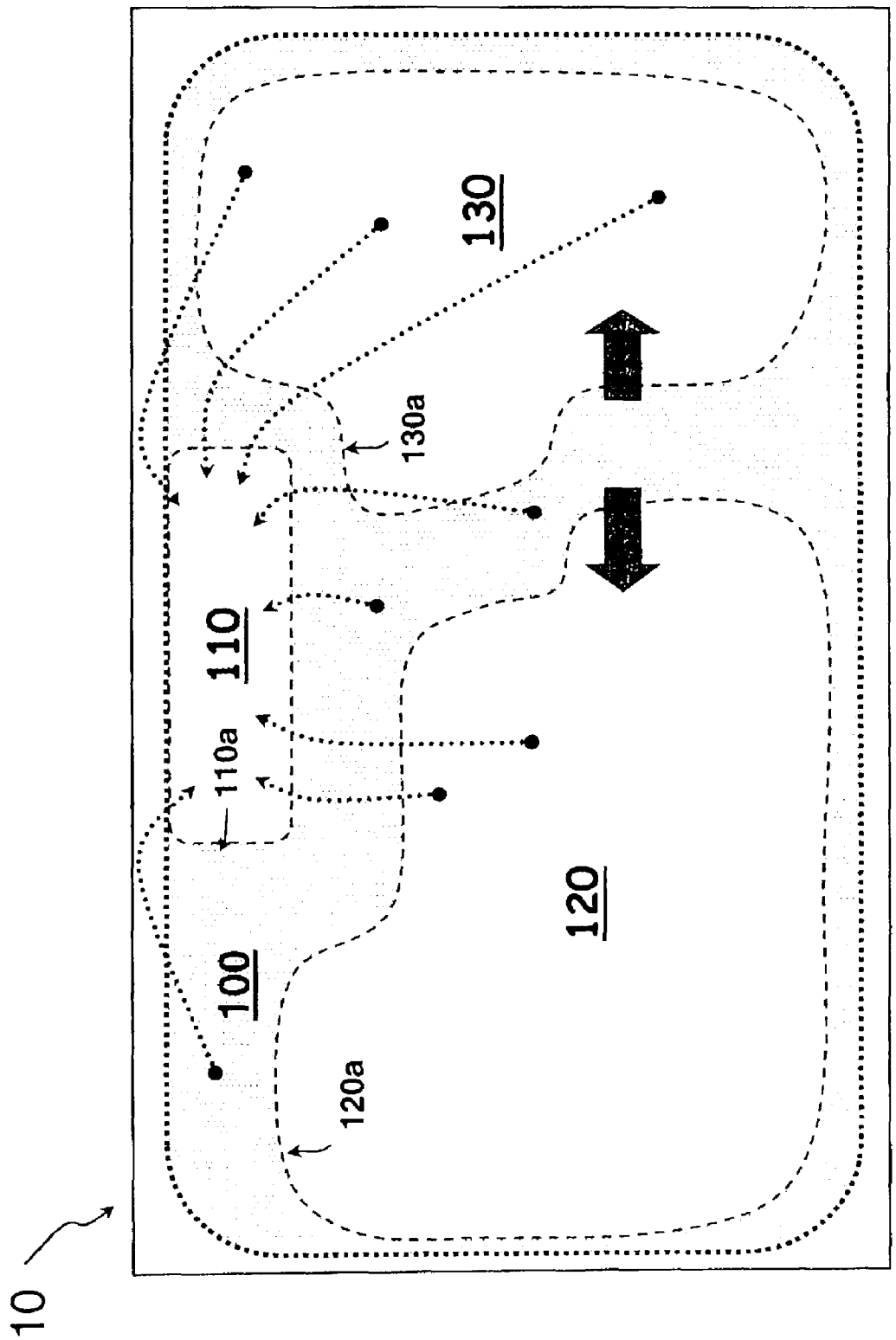
FIG. 1 a top view of a printed circuit board with preferred domains according to the invention.

FIG. 1 depicts a board 10 with such pre-composed architecture library domains, such as a processing domain 120, an IO-domain 130 and a support domain 110 embedded in a connector domain 100 on a board 10. The domains 100, 110, 120, 130 are pre-composed and pre-designed and exhibit a physical shape with specific borderlines 110a, 120a, 130a. The connector domain 100 is explained in detail in FIGS. 3 to 7.

Typically, the functional domains 100, 110, 120, 130 are formed by extracting the respective functions and electronics into the respective domain. For example, all system support functions and miscellaneous circuitry are extracted from the flat design of the board 10 into the support domain 110, which is indicated by dotted arrows. By separating processor related electronics from IO-subsystem electronics the processing domain 120 and the IO-domain 130 are formed, which is indicated by big arrows in the drawing.

The support domain 110 preferably comprises all non-primary function system support functions such as BMC and related electronics (flash memory devices, SRAM devices (SRAM=Static Random Access Memory), I2C interfaces (I2C=Inter-Integrated Circuit), etc.), system support storages (boot flash memory devices, NVRAM devices (Non-Volatile Random Access Memory), etc.)

system support functions, such as reset generation, wake up/sleeping sequencing, miscellaneous system support electronics.

The processing domain 120 preferably comprises direct processor subsystem related electronics such as CPU(s) (CPU=central processing unit), processing-domain (main-) clock generation, Northbridge/memory controller, memory subsystem (DIMM's (DIMM=dual inline module), control, data multiplexers, etc.), processing-domain power-subsystem.

The IO-domain 130 preferably comprises the system IO-generators/controllers such as IO-hub bus electronics/IO-bridges (i.e., PCI (PCI=Peripheral Component Interconnect), PCIe, PCIx, USB (USB=Universal Serial Bus), etc.), system network controllers (i.e. Ethernet/Gigabit-Ethernet, Fibre Channel, etc.), storage controllers, HDD subsystems (HDD=hard disk drive), etc.

Further functional domains can be defined, for example power domains and/or human-machine-interface domains.

The power domain preferably comprises main system power generation and distribution such as primary power regulators, power-fail detection circuitry/redundant power enabling, power integrity support components like filtering.

The human-machine-interface domain preferably comprises human-machine-interface functions/subsystems:

graphics/display controller, operator controls (keyboard, mouse, switches, haptic IO-devices, etc.), audio subsystem (multi-media support, recording, voice-recognition, etc.).

Additional system specific domains can be provided if required. Such pre-composed, pre-designed modules or domains are flexible to be reused in a target product family.

Figure 2B:
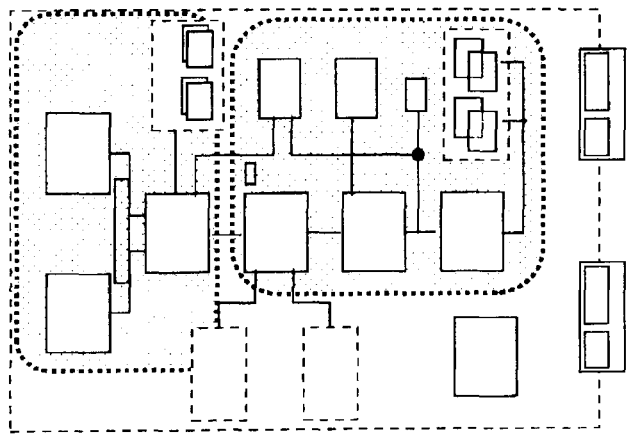
FIG. 2a,b,c a transition from a prior art flat design (FIG. 2a) to a logical architecture partition into functional domains (FIG. 2b) and a corresponding physical architecture with respective domains (FIG. 2c)
Figure 2C:
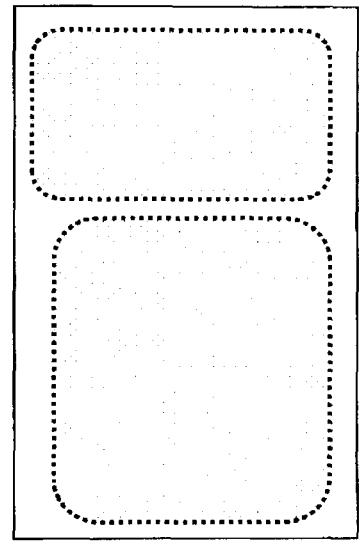
Figure 2A:
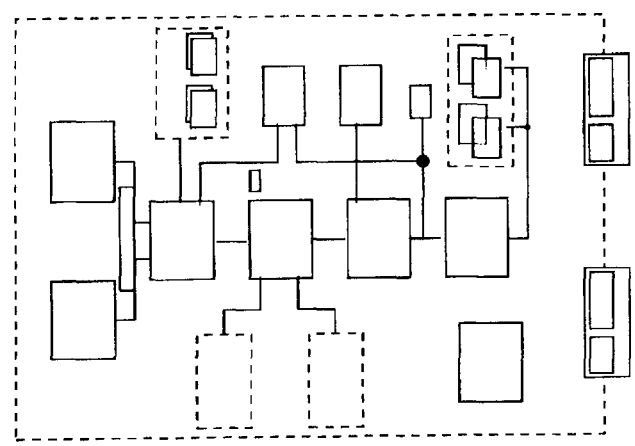

FIGS. 2a, 2b and 2c depict the transfer from prior art design to the design method according to the invention. A prior art flat design 20 is shown in FIG. 1 as a chart with several logical sub-systems, components etc. These are partitioned in domains as described above yielding a logical architecture as depicted in FIG. 2b by streaked areas symbolizing different domains. A correlated physical architecture is formed out of the logical architecture yielding physical domains on a board, indicated by streaked areas in FIG. 2c (not especially referred to with reference numbers).

Figure 3:
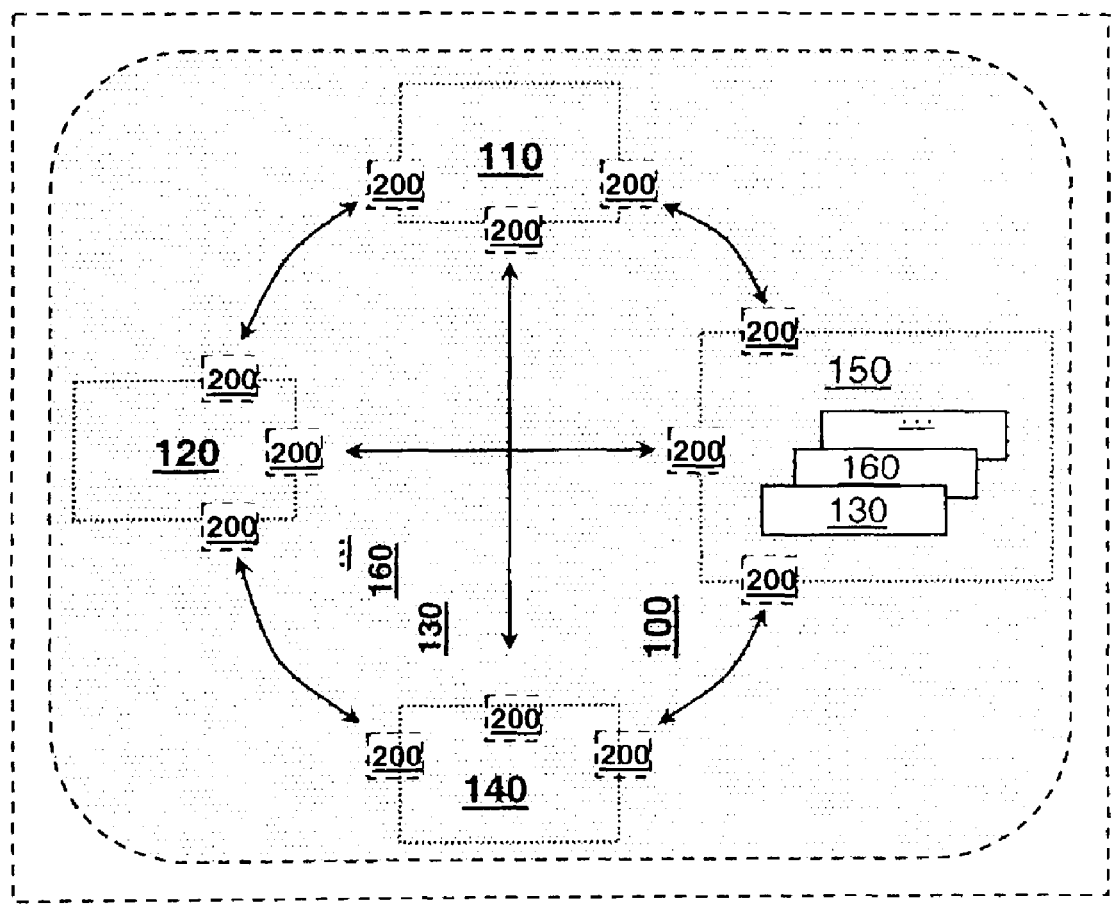
FIG. 3 system domains embedded in a connector domain and connected via virtual connectors.

As shown in FIG. 3, a domain bed and domain connectivity are a preferred key to reusable pre-composed modules or domains to meet the electrical, physical (form factors) and thermal requirements of the objected product family.

The domain bed forms a connector domain 100. The connector domain 100 provides an outer real-estate within which the functional domains are positioned on a board according to the target system requirements, for example a support domain 110, a processing domain 120, a power domain 140, and a functional domain 150 which comprises specific functions such as an IO-domain 130, a human-machine-interface 160 etc. The connector domain 100 takes into account system specific dimensions such as a board outline, area specific component height profiles, area specific thermal constraints. In FIG. 3 the connector domain 100 links the internal main system domains 110, 120, 140, 150. Typically, the connector domain 100 incorporates system, board and subsystem connectors, physical line drivers, transceivers and the like.

At the coordinates of each of the domain borderlines (dotted lines) virtual connectors 200 are positioned which are provided for interconnect the functional domains 110, 120, 140, 150, which is indicated by arrows between different virtual connectors 200. The virtual connectors 200 comprise all constraints to establish electrical connection to the target(s) according to the overall system design specifications and rules. Such constraint issues are electrical constraints (trace delay, relative delay, length matching, skew, impedance, via count, etc.), physical constraints (line width, differential pair gap, line spacing, pin-to pin spacing, line to via spacing, etc.), design constraints (design rule check definition, etc.).

Figure 4B:
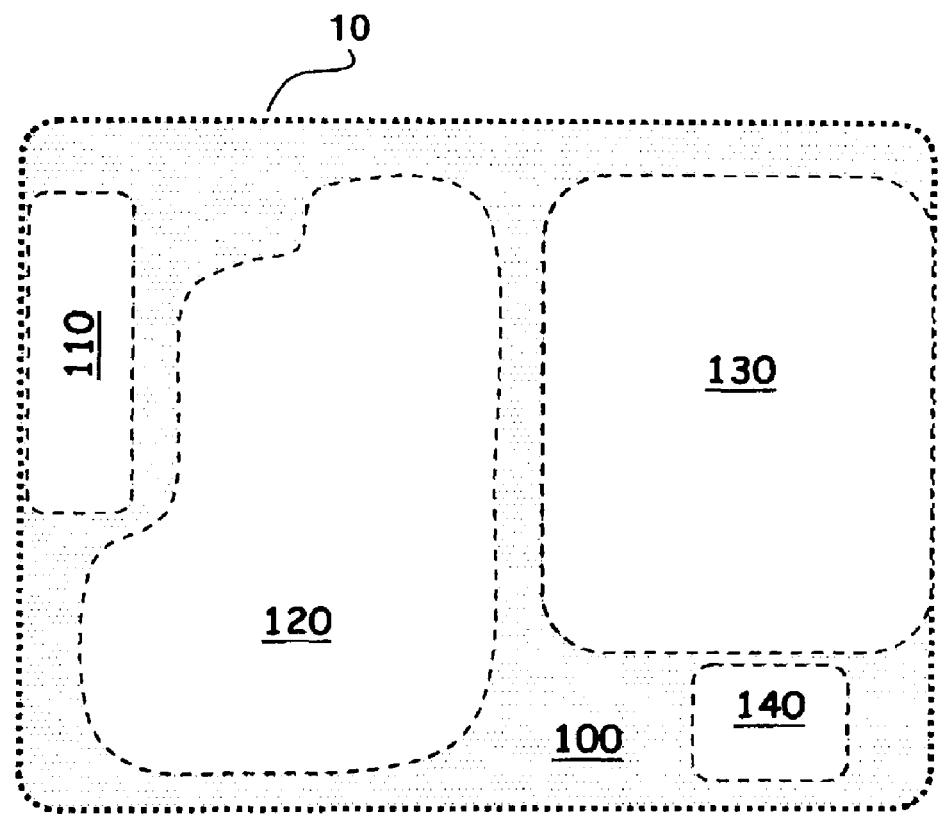
FIG. 4a,b implementation of reusable pre-defined modules for different boards of a product family for a power printed circuit board (FIG. 4a) and a desktop system (FIG. 4b)
Figure 4A:
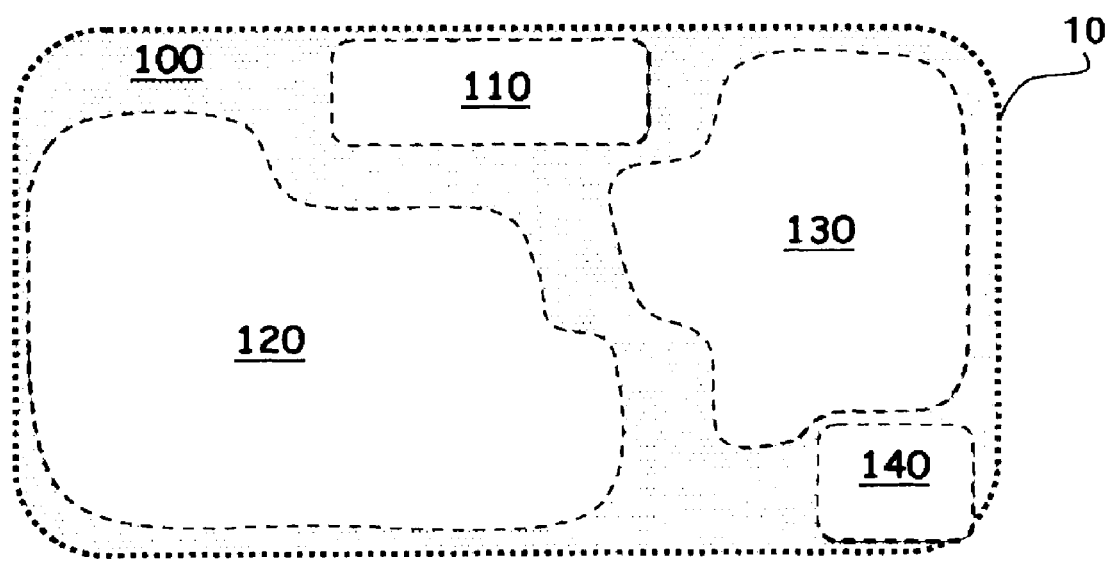

FIGS. 4a and 4b exemplify the reusing of pre-composed domains chosen from the preferred pre-composed architecture library.

Self-contained functional domains, support domain 110, processing domain 120, IO-domain 130, power domain 140 are embedded in a connector domain 100 as described above. A most preferred design rule is that all family design pre-composed domains 110, 120, 130, 140 are based on identical cross-sections of the PCB 10 (PCB=printed circuit board).

In FIG. 4a the domains 110, 120, 130, 140 are arranged on a board 10 of a power blade and in FIG. 4b the domains 110, 120, 130, 140 are arranged on a board 10 of a desktop system. The domains 110, 120, 130 and 140 exhibit physical shapes which can remain more or less unaltered on reusing the pre-composed domains 110, 120, 130, 140.

Typically, the physical shapes remain unaltered and the orientation of the domains 110, 120, 130, 140 is adapted. However, especially a domain like the IO-domain 130 may be subject of slight changes in its shape when applied to another board of a product family. Nevertheless, the design effort is only small for such a tuning of the respective shape.

FIGS. 5a, 5b and 5c explain the virtual connectors 200 introduced to interconnect the functional domains. FIGS. 8a, 8b, 8c depict a preferred embodiment with redundant virtual connectors 200, 260.

FIG. 5a shows schematically a processing domain 120 and an IO-domain 130 embedded in a connector domain 100 as described above. The processing domain 120 comprises a CPU/Northbridge 170 and the IO-domain 130 comprises an IO-hub. A virtual connector 200 located at the borderline 120a the processing domain 120 and a virtual connector 200 located in the borderline 130a of the IO-domain 130 interconnect the two top-level domains 120, 130 via a trace 230.

Each virtual connector 200 comprises at least one connector component 210, as is shown in FIG. 5b and FIG. 5c. Each connector component 210 has an input pad 220a which connects to an input trace 230a and an output pad 220b which connects to an output trace 230b of the trace 230. The connector components 210 can but need not necessarily be identical.

Generally, the virtual connector 200 has no electrical function and does not influence the signal integrity. The connector component 210 can be positioned in any layer of the respective outline cross section (embedded component technology).

FIG. 5b depicts an example for the case that the top-level domains 120, 130 are passing the connector domain 100. In this case, each connector 200 comprises a pair of connector elements 210. Reference numeral 240a symbolizes the internal connection from the CPU/Northbridge 170 to the first virtual connector 200 via signal trace 230a in the processing domain 120. Reference numeral 240b symbolizes the signal trace interconnecting the processing domain 120 to the connector domain 100. Reference numeral 240c symbolizes the signal trace passing the connector domain 100. 240d symbolizes the signal trace interconnecting the connector domain 100 and the IO-domain 130. 240e symbolizes the internal connection from the second virtual connector 200 to the IO-hub 180 via signal trace 230b in the IO-domain 130.

FIG. 5c depicts an example for the case that top-level domains 120, 130, i.e. the transmitting and receiving domains 120, 130, can directly connect. This is preferred if the connector domain 100 is of unique design, i.e. typically not reusable and thus not requiring virtual connectors at the connector domain 100. In this case, the connector components 210 are positioned only at the borderlines of the transmitting domain 120 and the receiving domain 130. Each virtual connector 200 comprises only a single connector component 210. Reference numeral 240f symbolizes the signal trace 230 passing the connector domain 100 and interconnecting the processing domain 120 and IO-domain 130 directly.

FIG. 8a depicts again a processing domain 120 connected to an IO-domain 130 via virtual connectors 200. FIG. 8b shows an implementation of redundant virtual connectors 200 and 260, wherein each domain 120, 130 has at least a second virtual connector 260 additional to the virtual connector 200. FIG. 8c shows a solution how the second virtual connector 260 can be selectively addressed via a virtual jumper 190. This provides more flexibility in implementation functional domains on a physical board.

FIGS. 6a, 6b and 6c show in more detail an implementation of the virtual connectors 200 shown in the preceding figures. As already mentioned, one virtual connector 200 comprises at least one connector component 210 with an input pad 220a and an output pad 220b with an input trace 230a connected to the input pad 220a and an output trace 230b connected to the output pad 220b. The pads 220a, 220b are connected via a resistor trace 250 (FIG. 6a). The resistor trace 250 is a zero Ohm resistor represented by a minimum length trace stub, the component pads 220a, 220b are represented by minimum length trace stubs and exhibit identical trace-widths for the resistor trace 250 and connector component pads 220a, 220b (FIG. 6b).

FIG. 6c shows the implementation of the connection to the CPU/Northbridge 170 to the IO-hub 180 as described in FIG. 5b. The trace lengths, referred to generally as "tl" in FIG. 6b, 6c, are equal for the pads 220a, 220b of the four connector components 210 with tl_2=tl_3=tl_4=tl_5. These are preferably minimum applicable design-entry tool trace length dimensions, for example 0.1 mil for a specific design. The trace lengths tl_1, tl_n, tl_m for the internal traces within the domains 120, 130 comprising the CPU/Northbridge 170 and the IO-hub 180, respectively, are chosen domain design specific and can consider origin component constraints. The design thicknesses (generally denoted "tt") is also system design specific, for example chosen for a given trace impedance of 50 Ohm, with equal widths tt_1=tt_2=tt_3=tt_4=tt_5.

Figure 7:
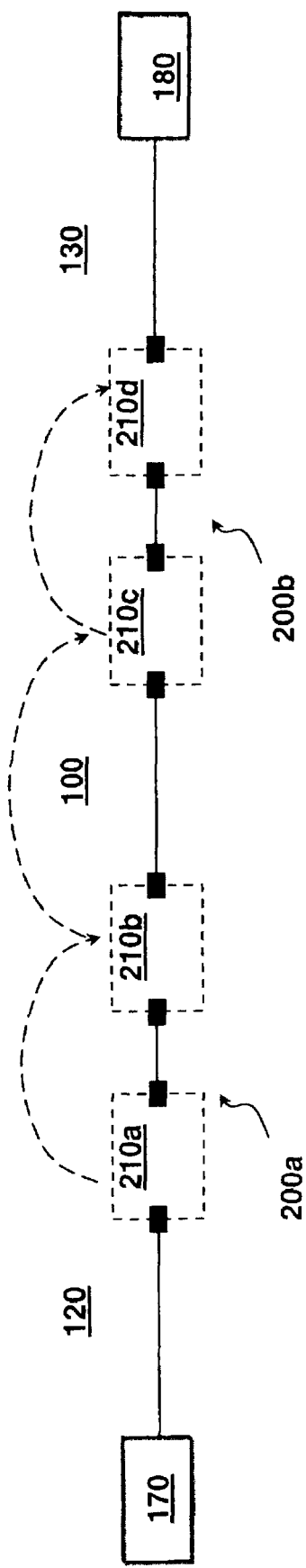
FIG. 7 an example of design constraints and constraint earnings.

FIG. 7 depicts how design constraints are implemented into virtual connectors 200a, 200b. The connectors 200a, 200b comprise each a pair of connector components 210a, 210b and 210c, 210d, respectively. A CPU/Northbridge 170 is arranged in a processing domain 120 and connected to an IO-hub 180 arranged in an IO-domain 130 passing a connector domain 100.

The CPU/Northbridge 170 exhibits design constraints, such as spacing and physical rules (trace length, minimum/maximum width, via definitions etc.), electrical parameters (impedance, cross talk, vias etc.), propagation delay/relative propagation delay (length matching, timing), and design rule check definitions. Constraints for the first connector component 210a for the first virtual connector 200a at the borderline of the processing domain 120 take care of these constraints. The CPU/Northbridge-constraints are subtracted/corrected by physical trace drive capability reduction in the processing domain 120, i.e. a remaining trace length, via count etc. is allowed from the first connector component point on. Thus, these constraints are transmitted to the second connector component 210b of the first virtual connector 200a and "earn" the first connector component constraints. The constraints for both connector components 210a, 210b are the same. The first connector component 210a is assigned to the processing domain 120, the second connector component 210b is assigned to the connector domain 100.

The second virtual connector 200b positioned at the borderline of the IO-domain 130 comprises a first connector component 210c assigned to the connector domain 100 and a second connector component 210d assigned to the IO-domain 130. For the first connector component 210c the design constraints are influenced by the constraints of the CPU/Northbridge 170. These constraints are subtracted/corrected by physical trace drive capability reduction of the processing domain 120 as well as of the connector domain 100, i.e. remaining trace length, via count, etc. are allowed from the point of the first connector component 210a of the first virtual connector 200a on. Thus, the second connector component 210d of the second virtual connector 200b earns the design constraints from the first connector component 210a. The design constraints for the first and the second connector components 210c, 210b of the second virtual connector 200b are the same. A reasonable design tool objective is that an automatic tool controlled constraint calculation is done for all respective virtual connectors following the first virtual connector 200a of the transmitting processing domain 120. Necessary changes can be implanted into the virtual connectors instead of the functional domains.

The invention can take the form of an entirely hardware embodiment, an entirely software embodiment or an embodiment containing both hardware and software elements. In an embodiment, the invention is implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

A computer processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

While a particular embodiment has been shown and described, various modifications of the present invention will be apparent to those skilled in the art.

What is claimed is:

1. A design method for designing electronic circuits on a printed circuit board, comprising:
    assembling a plurality of self-contained, pre-designed domains in the printed circuit board, wherein each of the domains is a module chosen from a pre-composed architecture library, comprising self-contained pre-designed electronic modules represented by logical architecture and corresponding physical architecture, and wherein the assembling is performed using a computing device,
    wherein the architecture library provides:
        the self-contained, pre-designed domains represented by logical architecture and corresponding physical architecture;
        virtual connectors representing at least one interconnect component positioned at a physical borderline of a domain outline; and
        a connector domain as an outer outline functioning as a container providing reserved real-estate areas for embedding the self-contained, pre-designed domains,
    wherein the virtual connector comprises at least one connector component, and
    the connector component represents a first connector tab connected to a connector input trace and a second connector tab connected to a connector output trace, wherein the tabs are connected by a resistor trace.

2. The method according to claim 1, wherein the tabs and the traces are represented by minimum length trace stubs.

3. The method according to claim 1, wherein trace widths of the tabs and the traces are identical.

4. The method according to claim 3, wherein the resistor trace is represented by a zero-Ohm resistor.

* * * * *